(12) United States Patent
Kim et al.

(10) Patent No.: US 9,288,900 B2
(45) Date of Patent: Mar. 15, 2016

(54) PRINTED CIRCUIT BOARD, DISPLAY DEVICE AND METHOD OF MANUFACTURING PRINTED CIRCUIT BOARD

(71) Applicant: Samsung Display Co., Ltd., Yongin, Gyeonggi-Do (KR)

(72) Inventors: You Bean Kim, Seoul (KR); Seock-Hwan Kang, Seoul (KR); Jong Seo Lee, Hwaseong-si (KR)

(73) Assignee: Samsung Display Co., Ltd., Yongin (KR)

( * ) Notice: Subject to any disclaimer, the term of this patent is extended or adjusted under 35 U.S.C. 154(b) by 134 days.

(21) Appl. No.: 14/054,308

(22) Filed: Oct. 15, 2013

(65) Prior Publication Data
US 2014/0321071 A1    Oct. 30, 2014

(30) Foreign Application Priority Data

Apr. 25, 2013    (KR) ..................... 10-2013-0046297

(51) Int. Cl.
  *H05K 1/02*    (2006.01)
  *H05K 3/46*    (2006.01)

(52) U.S. Cl.
  CPC .............. *H05K 1/0298* (2013.01); *H05K 1/024* (2013.01); *H05K 2201/0195* (2013.01); *H05K 2201/09972* (2013.01)

(58) Field of Classification Search
  CPC ... H05K 1/024; H05K 1/0213; H05K 3/4644; H05K 3/467
  See application file for complete search history.

(56) References Cited

U.S. PATENT DOCUMENTS

| | | | | |
|---|---|---|---|---|
| 3,136,680 | A | * | 6/1964 | Hochberg ....................... 442/233 |
| 3,244,795 | A | * | 4/1966 | Latimer ......................... 174/259 |
| 3,558,423 | A | * | 1/1971 | Rossetti, Jr. ................... 442/233 |
| 4,591,659 | A | * | 5/1986 | Leibowitz ...................... 174/256 |
| 4,710,854 | A | * | 12/1987 | Yamada et al. ................. 361/794 |
| 4,864,722 | A | * | 9/1989 | Lazzarini et al. ................ 29/830 |
| 5,417,800 | A | | 5/1995 | Takeshita |
| 5,925,203 | A | * | 7/1999 | Riddle et al. ................ 156/89.16 |
| 5,928,791 | A | * | 7/1999 | Rosenmayer ................. 428/421 |
| 7,161,810 | B2 | * | 1/2007 | Fraley et al. ................... 361/719 |
| 7,294,393 | B2 | * | 11/2007 | Murai et al. ................ 428/306.6 |
| 7,975,378 | B1 | * | 7/2011 | Dutta ............................. 29/830 |
| 2008/0311358 | A1 | | 12/2008 | Tomii et al. |
| 2011/0157842 | A1 | | 6/2011 | Bois et al. |
| 2013/0199828 | A1 | * | 8/2013 | Nakabayashi et al. ........ 174/257 |
| 2014/0231123 | A1 | * | 8/2014 | Onodera et al. .............. 174/255 |

FOREIGN PATENT DOCUMENTS

| | | | |
|---|---|---|---|
| JP | 2000-22291 | A | 1/2000 |
| JP | 2000286560 | A * | 10/2000 |
| JP | 2007-096159 | A | 4/2007 |
| JP | 2007-123712 | A | 5/2007 |
| JP | 2011-091066 | A | 5/2011 |
| KR | 10-0826349 | B1 | 5/2008 |
| KR | 10-0913309 | B1 | 8/2009 |

* cited by examiner

*Primary Examiner* — Jeremy C Norris
*Assistant Examiner* — Nathan Milakovich
(74) *Attorney, Agent, or Firm* — Knobbe Martens Olson & Bear LLP

(57) ABSTRACT

A printed circuit board includes an insulation layer adjacent to a high-speed signal wire layer. A low-loss material layer is provided between the high-speed signal wire layer and the insulation layer. As a result, it is possible to reduce frequency loss of a high-speed signal wire layer and improve reliability of the printed circuit board.

17 Claims, 17 Drawing Sheets

PRINTED CIRCUIT BOARD, DISPLAY DEVICE AND METHOD OF MANUFACTURING PRINTED CIRCUIT BOARD

CROSS-REFERENCE TO RELATED APPLICATION

This application claims priority to and the benefit of Korean Patent Application No. 10-2013-0046297 filed in the Korean Intellectual Property Office on Apr. 25, 2013, the entire contents of which are incorporated herein by reference.

BACKGROUND (a) Technical Field

The present disclosure relates to a printed circuit board, a display device, and a manufacturing method of the printed circuit board.

(b) Discussion of the Related Technology

Generally, a display device includes a display panel for displaying an image, and further includes a gate driver and a data driver connected to the display panel to transfer an image signal to each pixel in the display panel, and a printed circuit board (PCB) connected with the gate driver and the data driver to transfer the inputted image signal to a signal controller.

As the display panel, one of various display panels such as a liquid crystal panel, an organic light emitting panel, a plasma display panel, an electrophoretic display panel, and an electrowetting display panel may be used.

The liquid crystal panel includes a thin film transistor substrate and a color filter substrate which face each other, and a liquid crystal filled between the substrates. In addition, each driver transfers a scanning signal or an image signal to a gate wire or a data wire according to a control signal transferred from the printed circuit board. The printed circuit board may have a plurality of circuit elements such as an integrated circuit formed thereon, and transfer various control signals for driving the liquid crystal panel to the gate driver or the data driver.

As such, as the display device has a larger size and higher resolution, wires formed on the display panel are increased, and circuit elements and wires of the printed circuit board for controlling the wires are increased.

The above information disclosed in this Background section is only for enhancement of understanding of the background of the invention and therefore it may contain information that does not form the prior art.

SUMMARY

One aspect of the present invention provides a printed circuit board, a display device, and a method of manufacturing the printed circuit board having a low-loss material layer on an insulation layer adjacent to a high-speed signal wire layer. Such configuration provides advantages of reducing frequency loss. Further, production cost for a high-speed operation circuit or a larger size can be reduced.

An exemplary embodiment of the present invention provides a display device, including: a display panel; and a printed circuit board configured to apply a driving signal to the display panel, in which the printed circuit board includes a plurality of signal wire layers including one or more high-speed signal wire layers; insulation layers; and low-loss material layers, each of which is positioned adjacent one of the insulation layers and one of the one or more high-speed signal wire layers, and positioned between the adjacent insulation layer and the adjacent high-speed signal wire layer.

The low-loss material layer may have a thickness of about 15% to about 100% of a thickness of the adjacent insulation layer.

The low-loss material layer may include any one selected from the group consisting of hydrocarbon, ceramic, thermosetting polyester, high-performance FR4, and polytetrafluoroethylene (PTFE).

Another exemplary embodiment of the present invention provides a printed circuit board, including: a plurality of signal wire layers including one or more high-speed signal wire layers; a plurality of insulation layers, each of which is positioned adjacent one of the insulation layers and one of the one or more high-speed signal wire layers, and positioned between the adjacent insulation layer and the adjacent high-speed signal wire layer.

The low-loss material layer may have a thickness of about 15% to about 100% of a thickness of the adjacent insulation layer.

The low-loss material layer may include any one selected from the group consisting of hydrocarbon, ceramic, thermosetting polyester, high-performance FR4, and polytetrafluoroethylene (PTFE).

The number of the insulation layers may be an odd number, and the printed circuit board may have a laminated structure in which one of the insulation layers is disposed in the middle of the laminated structure and the other insulation layers are symmetrically arranged with respect to the insulation layer positioned in the middle.

The high-speed signal wire layer may be positioned at an outermost portion among the plurality of signal wire layers.

The high-speed signal wire layer may be positioned between two of the insulation layers which immediately neighbor each other, and one of the low-loss material layers is formed between the high-speed signal wire layer and one of the two insulation layers.

Another low-loss material layer among the low-loss material layers may be positioned between the high-speed signal wire layer and the other of the two insulation layers. The high-speed signal wire layer may contact the low-loss material layer and the other material layer. The low-loss material layers may contact the adjacent insulation layer and the adjacent high-speed signal wire layer.

The plurality of signal wire layers may include one or more low-speed signal wire layers having a signal transfer speed smaller than that of the high-speed signal wire layers. A signal transfer speed of the high-speed signal wire layer may be about 3.0 Gbps or more. Yet another exemplary embodiment of the present invention provides a method of manufacturing a printed circuit board, including: forming a signal wire layer on a substrate; forming an insulation layer on the formed signal wire layer; forming a low-loss material layer on the insulation layer; and forming a high-speed signal wire layer on the formed insulation layer.

The low-loss material layer may be formed by spraying a liquid-state low-loss material.

The low-loss material layer may be formed by forming a thin film with a film-state low-loss material.

The low-loss material layer may have a thickness of about 15% to about 100% of a thickness of the adjacent insulation layer.

The low-loss material layer may include any one selected from the group consisting of hydrocarbon, ceramic, thermosetting polyester, high-performance FR4, and polytetrafluoroethylene (PTFE).

According to the exemplary embodiment of the present invention, it is possible to reduce frequency loss of the high-speed signal wire layer and improve reliability of products for the reduction of the frequency loss.

Further, it is possible to reduce cost for manufacturing the printed circuit board by using a reduced amount of an expensive low-loss material layer. As an example, in the case of applying the exemplary embodiment of the present invention to a four-layered printed circuit board having a thickness of 1.0 mm, an effect of 90% or more may be achieved by cost of 4%, as compared with a product where all the insulation layers are formed of the low-loss material layer in the related art.

Further, it is possible to mass-produce a liquid crystal display with improved quality at reduced cost by reducing frequency loss which may be in a large-sized liquid crystal display.

DETAILED DESCRIPTION OF EMBODIMENTS

Figure 1A:
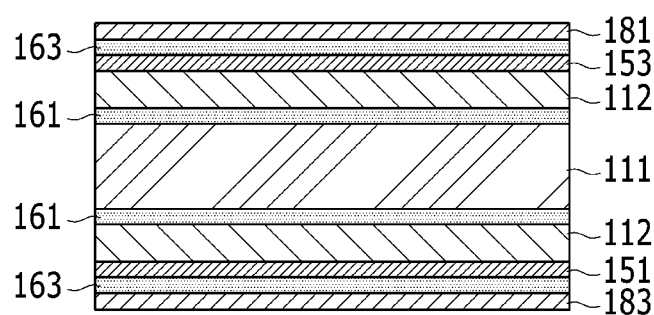
FIGS. 1A and 1B are cross-sectional views of four-layered printed circuit boards according to an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. The drawings and description are to be regarded as illustrative in nature and not restrictive. Like reference numerals designate like elements throughout the specification.

In addition, the size and thickness of each configuration shown in the drawings are arbitrarily shown for understanding and ease of description, but the present invention is not limited thereto.

In the drawings, the thickness of layers, films, panels, regions, etc., are exaggerated for clarity. In the drawings, for understanding and ease of description, the thickness of some layers and areas is exaggerated. It will be understood that when an element such as a layer, film, region, or substrate is referred to as being "on" another element, it can be directly on the other element or intervening elements may also be present, but does not essentially mean positioning on the upper side of the object portion based on a gravity direction.

In addition, unless explicitly described to the contrary, the word "comprise" and variations such as "comprises" or "comprising", will be understood to imply the inclusion of stated elements but not the exclusion of any other elements.

A printed circuit board according to an exemplary embodiment of the present invention will be described in detail with reference to FIGS. 1A and 1B.

Figure 1B:
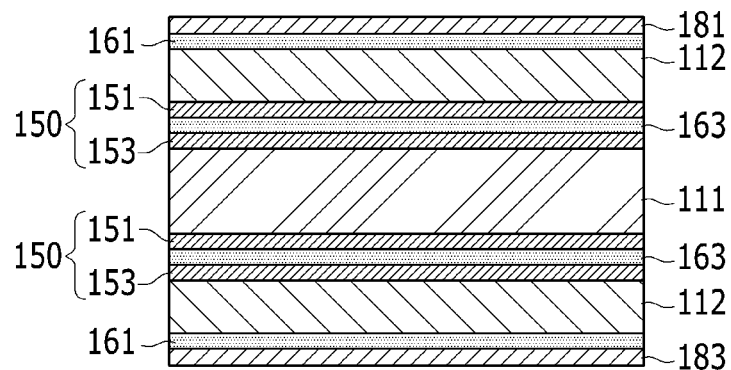

FIGS. 1A and 1B are cross-sectional views of four-layered printed circuit boards according to an exemplary embodiment of the present invention.

The printed circuit board according to the exemplary embodiment of the present invention includes insulating layers 111 and 112, low-loss material layers 151 and 153, signal wire layers 161 and 163, and protective layers 181 and 183.

Each of the insulating layers 111 and 112 are positioned between two among the plurality of signal wire layers in order to electrically insulate the signal wire layers from each other. In embodiments, the plurality of signal wire layers includes general signal wire layers (or low-speed signal wire layers) and high-speed signal wire layers. The insulating layer 111 may be positioned between two of the general signal wire layers for insulating the two layers. The insulating layer 112 may be positioned between one of the high-speed signal wire layers and one of the general signal wire layers and insulate from each other. Accordingly, in embodiments, two or more insulating layers may be used to insulate three or more signal wire layers.

The insulating layers 111 and 112 may be made of any electrically insulating material, for example, FR4.

Each of the low-loss material layers 150, 151, and 153 are positioned between a corresponding one of the high-speed signal wire layers and a corresponding one of the insulating layers adjacent to the corresponding high-speed signal wire layer. This configuration can avoid or minimize frequency-dependent loss that may be generated when transferring the high-speed signals and/or the distortion of the high-speed signals when compared with a structure of the insulating layer contacting the corresponding high-speed signal wire layer.

In embodiments, the low-loss material layer 151 is formed on the upper side of the high-speed signal wire layer 163, and the low-loss material layer 153 is formed on the lower side of the high-speed signal wire layer 163. The low-loss material layers 151 and 153 formed on the upper side and the lower side may be represented by the low-loss material layer 150 when there is no need to distinguish the low-loss material layers 151 and 153 from each other.

Further, the low-loss material layer 151 positioned at the upper side and the low-loss material layer 153 positioned at the lower side may be the same material or different materials. Any material for reducing loss of the frequency as compared with an existing insulating layer (for example, FR4) may be applied to the low-loss material layer 150. However, the exemplary embodiment of the present invention may include one of hydrocarbon, ceramic, thermosetting polyester, high-performance FR4, and polytetrafluoroethylene (PTFE).

Further, the low-loss material layer 150 may be formed by any method, but for example, may be coated or laminated. In detail, the low-loss material may be sprayed in the case of a liquid state, and may be thinly deposited in the case of a solid state of a film form.

The formed low-loss material layer 150 may be about 15% to about 100% of a thickness of the corresponding insulating layer adjacent to the low-loss material layer. In the case of about 15% or more, signal distortion may be avoided or minimized. In the case of about 100% or less, costs for mass production will not be excessively increased. In embodiments, when the insulating layer has a thickness of 112 μm, the low-loss material layer may have a thickness of 16.8 μm to 112 μm.

The signal wire layers 161 and 163 include predetermined patterns for electrically connecting various electronic components installed on the printed circuit board 100 in addition to a power pattern and a ground pattern. The patterns may be formed through processes such as exposure, corroding, and releasing, after cutting the substrate.

In embodiments, the signal layers may include one or more high-speed signal wire layers 163 and one or more low-speed signal wire layers (general signal wire layers) 161. The high-speed signal wire layers 163 transfer signals at a speed higher than that of the low-speed signal wire layers 161. In one embodiment, the high-speed signal wire layers 163 transfer signals at a speed equal or greater than a particular value, for example, about 3.0 Gbps.

In the illustrated embodiments, the signal of 3.0 Gbps or more is transferred to the high-speed signal wire layer 163, and the high-speed signal wire layer 163 may be positioned even on any layer in the printed circuit board, but may be positioned at an outermost portion except for the protective layer. This is one of the structures for improving quality of a high-speed signal.

The protective layers 181 and 183 are formed on an upper side 181 and a lower side 183 of the printed circuit board, and formed by coating invariable ink to protect the printed circuit board under a physical or chemical environment and provide durability on the circuit. The ink may be photoimageable solder resist mask (PSR) ink as an example, and the same ink may be coated on the upper side 181 and the lower side 183.

The exemplary embodiment of the present invention will be further described with reference to FIG. 1A.

First, an insulating layer 111 including FR4 and the like is positioned between general signal wire layers 161. However, the insulating layer 111 may be a substrate according to another exemplary embodiment. Next, an insulating layer 112 is positioned next to each of signal wire layers 161. However, the insulating layer 112 may have a thickness smaller than that of the insulating layer 112 positioned between the signal wire layers 161.

Thereafter, the low-loss material layers 151 and 153 are positioned on the insulating layers 112. The low-loss material layer 153 is positioned above the insulating layer and the low-loss material layer 151 is positioned below the insulating layer.

Next, the high-speed signal wire layer 153 is positioned at the upper side of the upper low-loss material layer 153, and subsequently, an upper protective layer 181 for protecting the printed circuit board 100 from a physical and chemical environment is positioned.

The lower part of the printed circuit board 100 also has substantially the same configuration as the upper side. First, the high-speed signal wire layer 153 is positioned at the lower side of the lower low-loss material layer 151, and subsequently, a lower protective layer 183 for protecting the printed circuit board 100 from a physical and chemical environment is positioned.

Accordingly, the exemplary embodiment of the present invention includes three insulating layers 111 and 112, and since the signal wire layers 161 and 163 are four, the printed circuit board is called a four-layered printed circuit board based on the number of signal wire layers 161 and 163.

The printed circuit board according to the exemplary embodiment of the present invention has a symmetrical structure with respect to the insulating layer 111 positioned in the middle.

According to the exemplary embodiment of the present invention, FIG. 1A illustrates only the four-layered printed circuit board, but the exemplary embodiment of the present invention is not limited thereto, and may be applied to all two or more-layered printed circuit boards.

As an example, in the two-layered printed circuit board, an insulating layer 111 is formed at the center, a lower low-loss material layer 153 is positioned on an upper surface of the insulating layer, and an upper low-loss material layer 151 is positioned on a lower surface of the insulating layer.

Next, on each of the low-loss material layers 151 and 153, a high-speed signal wire layer 163 is positioned, and finally, protective layers 181 and 183 are positioned.

Further, similarly to those described above, the number of layers is not limited, and similarly to FIG. 1A, when the high-speed signal wire layer 163 is positioned at the outermost portion of the plurality of signal wire layers 161 and 163, the lower low-loss material layer 153 is positioned on the lower surface of the high-speed signal wire layer 163 positioned at the upper side, and the upper low-loss material layer 151 is positioned on the upper surface of the high-speed signal wire layer 163 positioned at the lower side. That is, in a four or more-layered printed circuit board, a plurality of insulating layers and signal wire layers may be positioned between the bottom low-loss material layer 153 and the top low-loss material layer 151.

Next, another exemplary embodiment of the present invention will be described with reference to FIG. 1B.

Differently from FIG. 1A, the lower low-loss material layer 153 and the upper low-loss material layer 151 may be positioned at both sides of the insulating layer 111. Thereafter, the high-speed signal wire layer 163 contacting the low-loss material layer is positioned.

Next, the upper low-loss material layer 151 is positioned on the high-speed signal wire layer 163 positioned at the upper side, and the lower low-loss material layer 153 is positioned below the high-speed signal wire layer 163 positioned at the lower side.

In the exemplary embodiment, the low-loss material layers 150 are positioned on both sides of the high-speed signal wire layer 163, but one of two may be omitted, but the invention is not limited thereto.

Further, the low-loss material layers 151 and 153 positioned at both sides of the high-speed signal wire layer 163 may have a thickness different from that of a low-loss material layer of a configuration in which the low-loss material layer is positioned only at one of the both sides.

Next, the insulating layer 112, the signal wire layer 161, and the upper protective layer 181 are sequentially positioned on the upper low-loss material layer 151 positioned at the upper side.

Similarly to this, the insulating layer 112, the signal wire layer 161, and the lower protective layer 183 are sequentially positioned on the lower low-loss material layer 153 positioned at the lower side.

As illustrated in FIG. 1A, FIG. 1B also has a symmetrical structure.

Figure 2A:
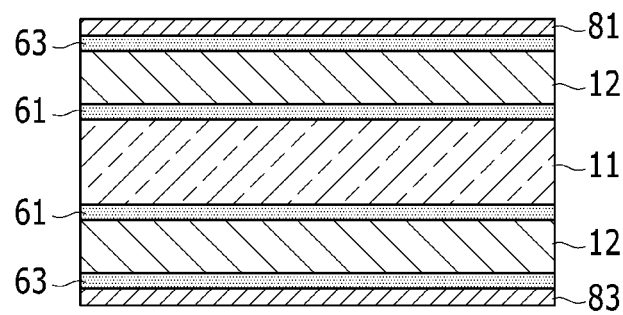
FIGS. 2A-2C are cross-sectional views of printed circuit boards according to a Comparative Example.
Figure 2B:
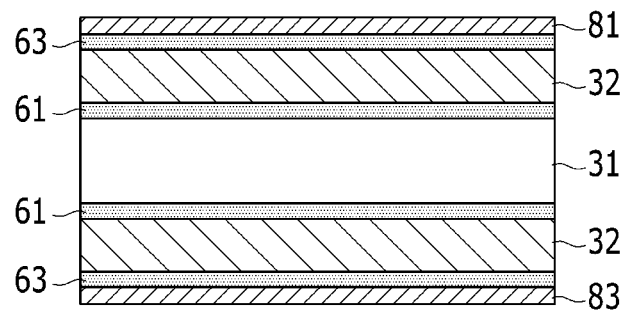
Figure 2C:
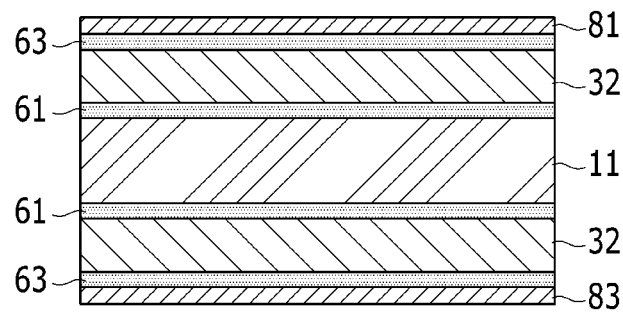

Hereinafter, Comparative Examples of FIGS. 2A-2C will be described. FIGS. 2A-2C are cross-sectional views of printed circuit boards according to Comparative Examples.

Like the Comparative Example illustrated in FIG. 2A, the most typical insulator of the printed circuit board is FR4 11 and 12. However, when the printed circuit board includes a high-speed operation circuit part operating at a high speed such as a dual data rate (DDR) memory, a universal serial bus (USB), and a high density multimedia interface (HDMI), in the case of a high-speed signal, a high-frequency component is not accurately transferred due to a frequency-dependent loss characteristic, and as a result, the signal may be distorted.

To reduce the distortion, as another Comparative Example, as illustrated in FIGS. 2B and 2C, a different structure is provided by replacing the insulating layers of the structure shown in FIG. 2A with the low-loss materials 31 and 32. In the illustrated example, the entire material of an insulating layer is replaced with a high-priced low-loss material, and thus manufacturing costs may increase, and the structure would not be compatible to mass-production.

Next, according to another exemplary embodiment of the present invention, a display device including a display panel 200 and the printed circuit board 100 described above applying a driving signal to the display panel 200 is provided and will be described below with reference to FIG. 3.

Figure 3:
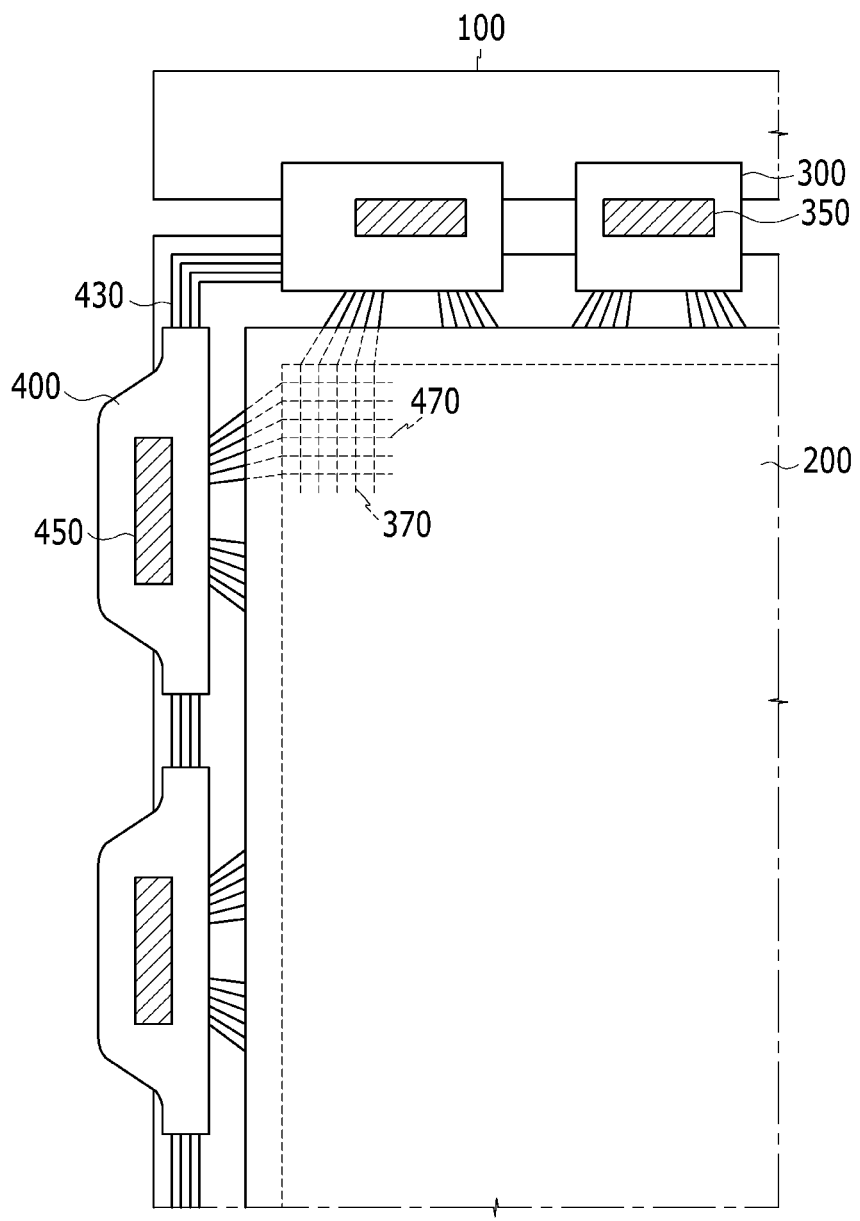
FIG. 3 is a diagram of a display device including the printed circuit board according to the exemplary embodiment of the present invention.

FIG. 3 is a diagram of a display device including the printed circuit board according to the exemplary embodiment of the present invention.

FIG. 3 illustrates a data film 300 and a gate film 400 connected with the display panel 200, and the printed circuit board 100. As illustrated above, the data film 300 is formed in a short-axial direction of the display panel 200. A wire and a data driving chip 350 are included in the data film 300, and the printed circuit board 100 is connected to an opposite side of the display panel 200.

Here, the printed circuit board 100 may use one of the printed circuit boards illustrated in FIGS. 1A and 1B, and may include a signal controller (not illustrated).

The wire of the data film 300 is formed to transfer the signal of the printed circuit board 100 to the data driving chip 350 and transfer the signal of the data driving chip 350 to a data line 370 of the display panel 200.

In addition, the printed circuit board 100 also includes a wire transferring a signal transferred to the gate driving chip 450 to a gate connection wire 430.

Meanwhile, the gate film 400 is formed in a long-axial direction of the display panel 200. A wire and the gate driving chip 450 are formed in the gate film 400. The signal inputted to the gate driving chip 450 is transferred through the gate connection wire 430 formed on the display panel 200.

The gate driving chip 450 and the data driving chip 350 transfer the transferred signals to the gate line 470 and the data line 370 to display an image.

The gate film 400 and the data film 300 may be formed of a flexible printed circuit (FPC) film.

In FIG. 3, the gate driving chip 450 is positioned on the gate film 400, but may be formed directly on the lower substrate without the gate film 400 or integrated by the same process as the thin film transistor formed in the display panel 200.

Next, a manufacturing method of the printed circuit board according to yet another exemplary embodiment of the present invention will be described with reference to FIG. 4.

Figure 4:
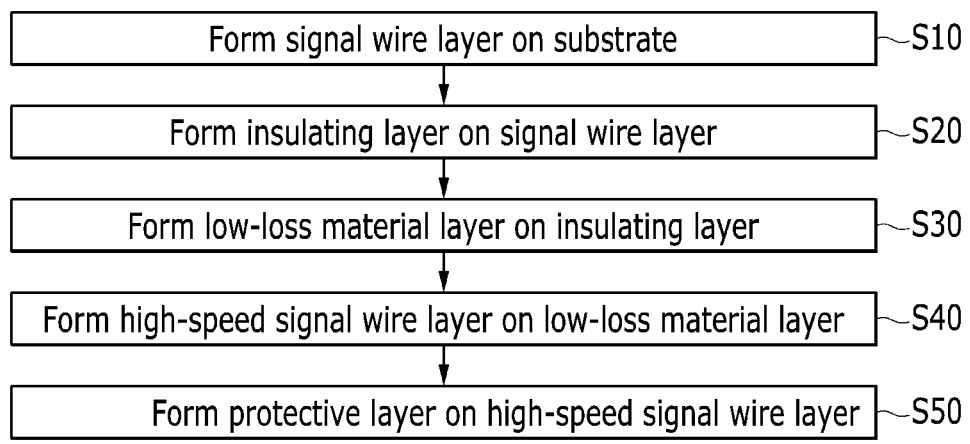
FIG. 4 is a flowchart of a manufacturing method of the printed circuit board according to the exemplary embodiment of the present invention.

FIG. 4 is a flowchart of a manufacturing method of the printed circuit board according to the exemplary embodiment of the present invention.

In the specification, the manufacturing method for the exemplary embodiment of the present invention is described based on the four-layered printed circuit board, but is not limited thereto, and a manufacturing method of any printed circuit board including a high-speed signal wire layer and an insulating layer may also be used.

First, a signal wire layer is formed on a substrate (S10). The signal wire layer may be formed through processes such as exposure, corroding, and releasing, after cutting the substrate according to product specifications to be applied.

Next, an insulating layer is formed on the formed signal wire layer (S20). Step S20 is a step of laying-up the substrate with the signal wire layer formed in the step S10 and the insulating layer.

Next, a low-loss material layer is formed on the insulating layer formed in step S20 (S30). Further, in step S30, forming the low-loss material layer may use any method in the related art. In embodiments, the low-loss material layer may be formed by spraying a liquid-state low-loss material or depositing a film-state low-loss material to make a thin film.

Further, in step S30, the low-loss material layer may be formed to have a thickness of about 15% to about 100% of a thickness of the adjacent insulating layer. As an example, when the thickness of the insulating layer is 112 μm, the low-loss material layer may have a thickness of 16.8 μm to 112 μm.

Further, the low-loss material layer may include any material which has smaller frequency loss than an existing insulating layer (for example, FR4). In embodiments, the low-loss material layer may include any one of hydrocarbon, ceramic, thermosetting polyester, high-performance FR4, and polytetrafluoroethylene (PTFE).

Next, a high-speed signal wire layer is formed on the insulating layer formed in step S30 (S40).

In alternative embodiments, step S40 of forming the high-speed signal wire layer and step S10 of forming the signal wire layer on the substrate may be performed at the same time, and the printed circuit board according to embodiments of the present invention may be manufactured by forming the insulating layers among the plurality of signal wire layers formed in steps S40 and S10.

Next, a protective layer is formed at the printed circuit board in which the high-speed signal wire layer is positioned at the outermost portion (S50) to protect the printed circuit board from an external environment.

In the case where a high-speed signal wire layer is positioned between two immediately neighboring insulating layers in a printed circuit board, the manufacturing method may include forming low-loss material layers at both of the upper side and the lower side of the high-speed signal wire layer.

FIG. 4 illustrates the manufacturing method of the four-layered printed circuit board according to the exemplary embodiment of the present invention, but of course, the manufacturing method may be applied to all two or more-layered printed circuit boards.

In a manufacturing method of a two-layered printed circuit board, first, low-loss material layers are formed at both sides of an insulating layer which is to be positioned in the middle of the completed printed circuit board.

Next, high-speed signal wire layers are formed on the low-loss material layers, respectively.

Next, protective layers are formed on the formed high-speed signal wire layers, respectively.

In summary, the manufacturing method of the two-layered printed circuit board may be performed through step 3 and step 4 of the manufacturing method of the four-layered printed circuit board discussed above.

Further, a manufacturing method of a six-layered printed circuit board may be performed by repeating step 1 and step 2 of the manufacturing method of the four-layered printed circuit board once more.

Accordingly, the manufacturing method of any six or more layered printed circuit board may be performed by adjusting the number of repetition of step 1 and step 2 of the manufacturing method of the four layered printed circuit boards.

Hereinafter, features of the printed circuit board according to the exemplary embodiment of the present invention will be described with reference to FIGS. 5A to 10.

The following experiment (hereinafter, experiment 1) is performed in order to check insertion loss for a printed circuit board manufactured in Example 1 and a printed circuit board according to a Comparative Example.

Figure 5B:
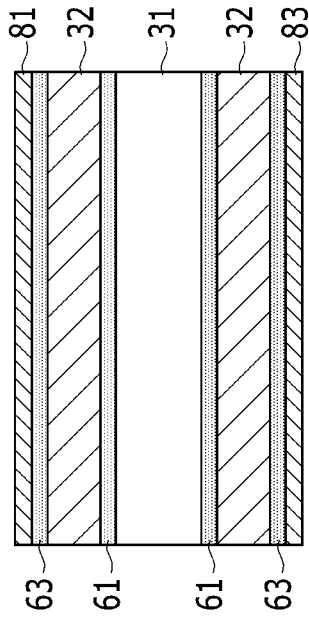
FIG. 5B shows a cross-sectional view of a printed circuit board in which the entire insulating layer is PTFE.
Figure 5D:
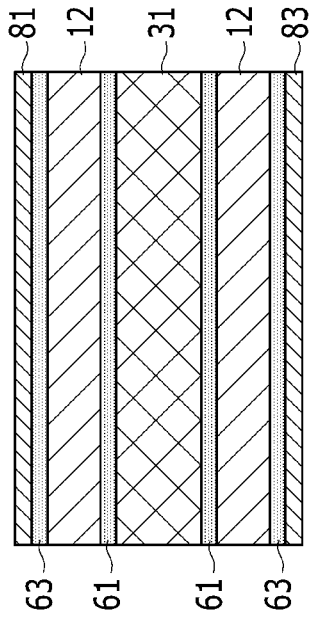
FIG. 5D shows a cross-sectional view of a printed circuit board in which only the insulating layer which is not adjacent to the high-speed signal wire layer is PTFE, respectively.
Figure 5A:
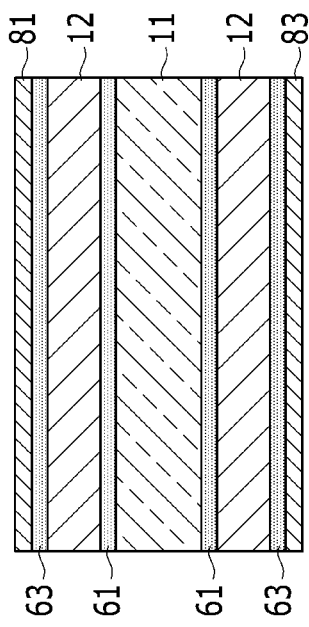
FIG. 5A shows a cross-sectional view of a printed circuit board in which the entire insulating layer is FR4.
Figure 5C:
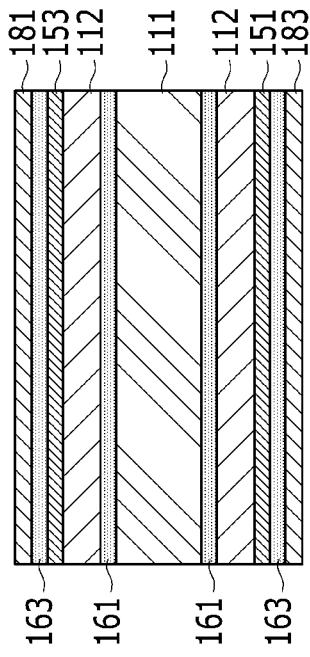
FIG. 5C shows a cross-sectional view of a printed circuit board in which a part of an insulating layer adjacent to a high-speed signal wire layer is PTFE.

In detail, FIG. 5A illustrates a printed circuit board in which respective insulating layers are made of FR4, FIG. 5B illustrates a printed circuit board in which respective insulating layers are made of PTFE, FIG. 5C illustrates a printed circuit board in which only some of the insulating layers adjacent to the high-speed signal wire layer include PTFE (exemplary embodiment of the present invention), and FIG. 5D illustrates a printed circuit board (D) in which an insulating layer positioned in the middle among three insulating layers is made of PTFE, and both insulating layers are made of FR4. The thickness of all the four-layered PCBs is 1 mm.

Figure 6:
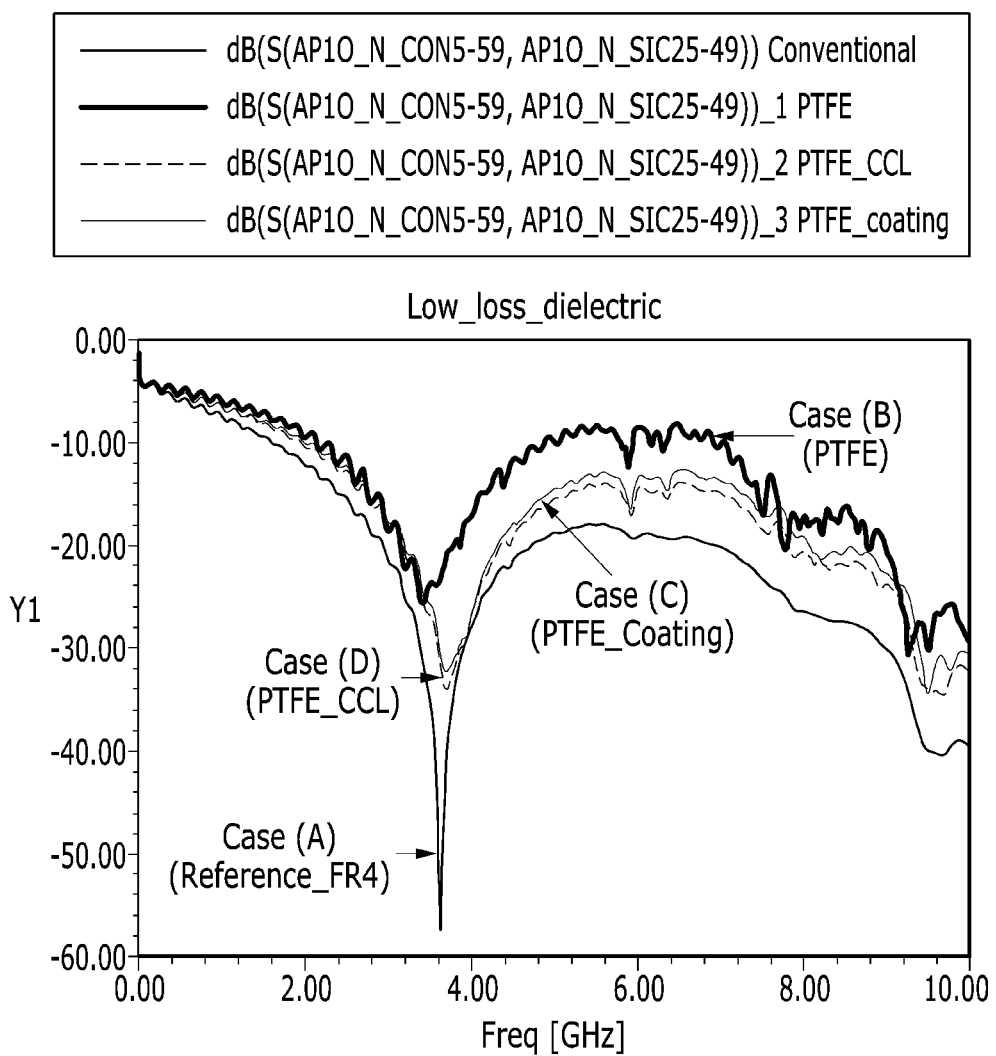
FIG. 6 is a graph illustrating s-parameters corresponding to the respective printed circuit boards shown in FIGS. 5A to 5D.
Figure 7A:
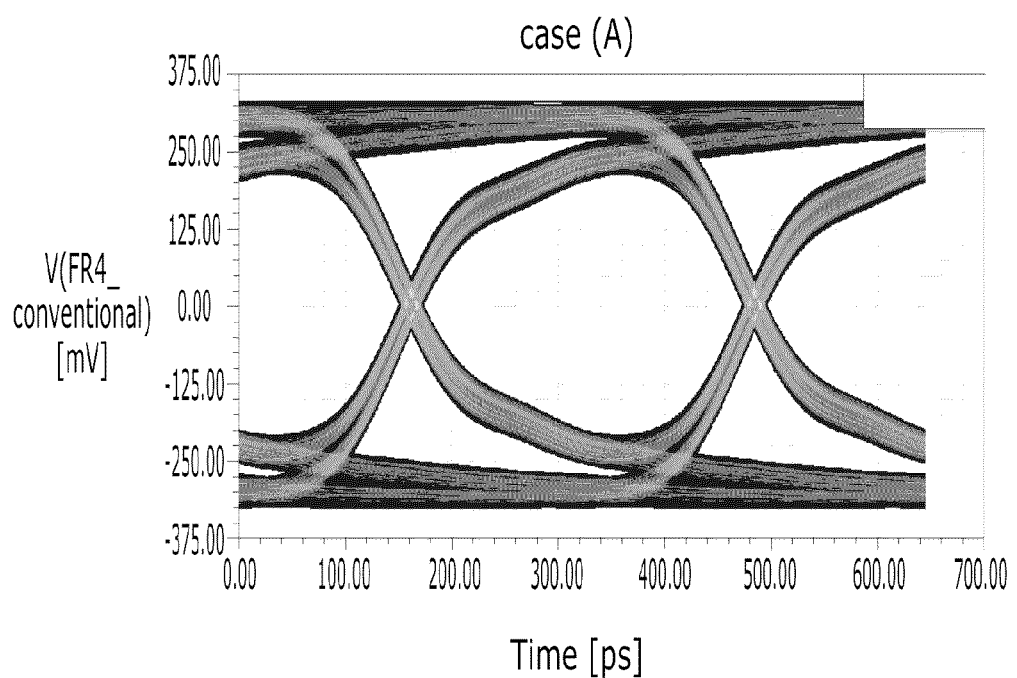
FIGS. 7A-7D illustrates eye diagrams corresponding to the respective printed circuit boards shown in FIGS. 5A to 5D.
Figure 7B:
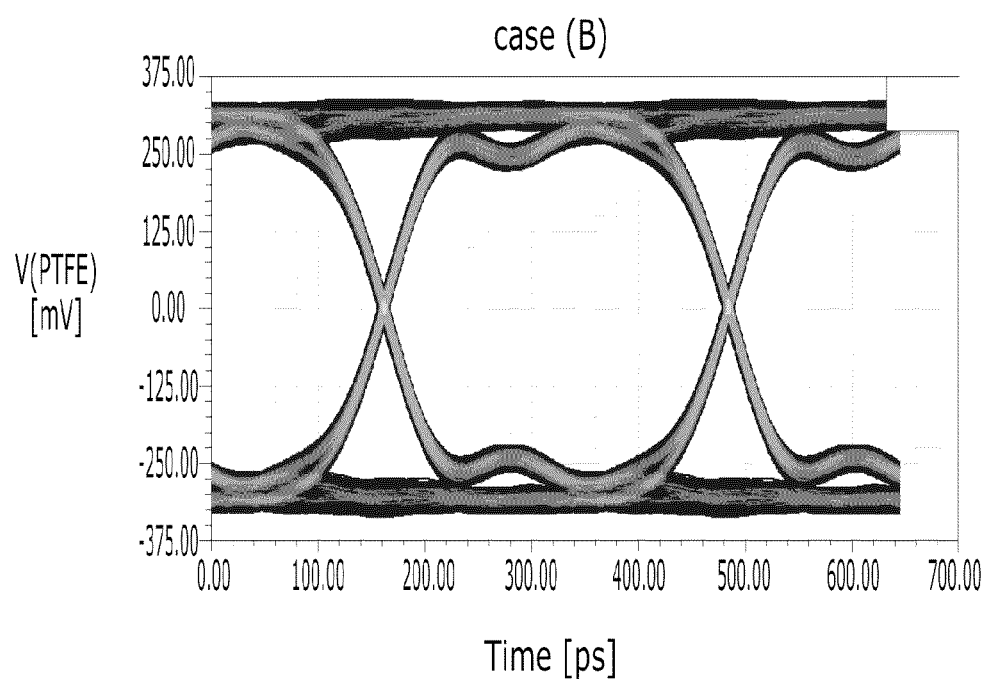
Figure 7C:
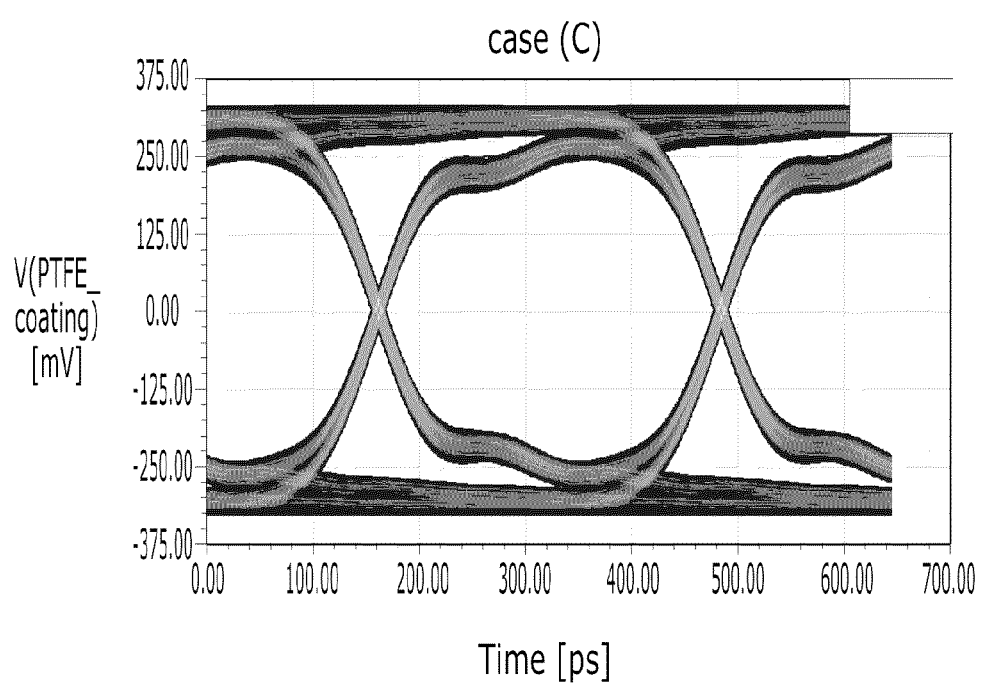
Figure 7D:
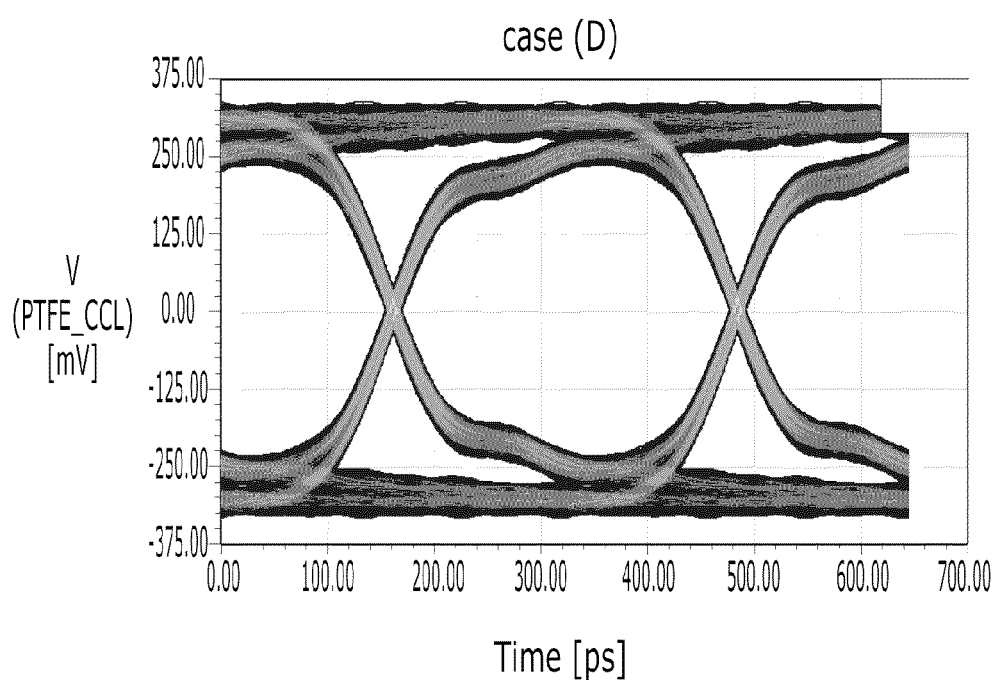

FIG. 6 is a graph illustrating s-parameters corresponding to the respective printed circuit boards of FIGS. 5A-5D.

FIGS. 7A-7D illustrates eye diagrams corresponding to the respective printed circuit boards shown in FIGS. 5A to 5D.

First, insertion loss is measured by extracting an s-parameter in the range of 0 to 10 GHz of a frequency and then illustrated in FIG. 6. The s-parameter, as a ratio of an initially inputted size and a transmitted and outputted size for each frequency, means that loss is small and signal quality is good as being closer to 0 dB.

According to FIG. 6, in an aspect of a signal transfer characteristic, the printed circuit board (B) in which all the insulating layers are PTFE has a value closest to 0 dB and has the best signal quality. The printed circuit board (C) according to the exemplary embodiment of the present invention has good signal quality and follows the printed circuit board (B). The printed circuit board (D) follows the printed circuit board (C), and the printed circuit board (A) follows the printed circuit board (D).

In this case, although the printed circuit board in which all the insulating layers are PTFE has the most excellent signal transfer characteristic, a printed circuit board in accordance with the exemplary embodiment of the present invention, in which only a small amount of low-loss material is used, may maintain a sufficient signal transfer characteristic.

Further, transient simulation of output for an input signal is performed in a time region by using the s-parameter.

The transient simulation in which voltage of 3.1 Gbps is applied to each printed circuit board is performed and then an eye diagram is illustrated in each of FIGS. 7A-7D, and numerical values for the printed circuit boards are illustrated in Table 1. The greater an area of a closed portion located at the center of the eye diagram is, the better the signal quality is.

TABLE 1

|     | Eye height (mV) | Eye width (ps) | Increase of eye height (%) |
|-----|-----------------|----------------|----------------------------|
| (A) | 278.30          | 289.00         | reference value            |
| (B) | 423.19          | 308.52         | 52                         |
| (C) | 371.07          | 303.44         | 33                         |
| (D) | 354.34          | 300.74         | 27                         |

Referring to FIGS. 7A-7D and Table 1, similarly to the results of the s-parameters, the printed circuit board (B) in which all the insulating layers are made of low-loss materials has the highest signal quality, and the printed circuit board (C) according to the exemplary embodiment of the present invention has good signal quality and follows the printed circuit board (B). The quality increase of 33% of the printed circuit board (C) is about 88% of the quality increase of the printed circuit board (B). In view of this, the printed circuit board (C) shows that a sufficient signal quality effect can be obtained by introducing a relatively small amount of low-loss material.

Next, the following experiment (hereinafter, experiment 2) is performed in order to check the improvement of the signal quality according to a thickness of the low-loss material layer formed at the insulating layer adjacent to the high-speed signal wire layer.

In detail, with respect to the printed circuit boards in which thicknesses of the low-loss material layer is 30 μm, 60 μm, and 90 μm, s-parameters and eye diagrams obtained from transient simulation are illustrated in FIGS. 8 and 9A-9E. Further, for a more accurate analysis, an s-parameter graph and an eye diagram derived from Experimental Example 1 are used.

Figure 8:
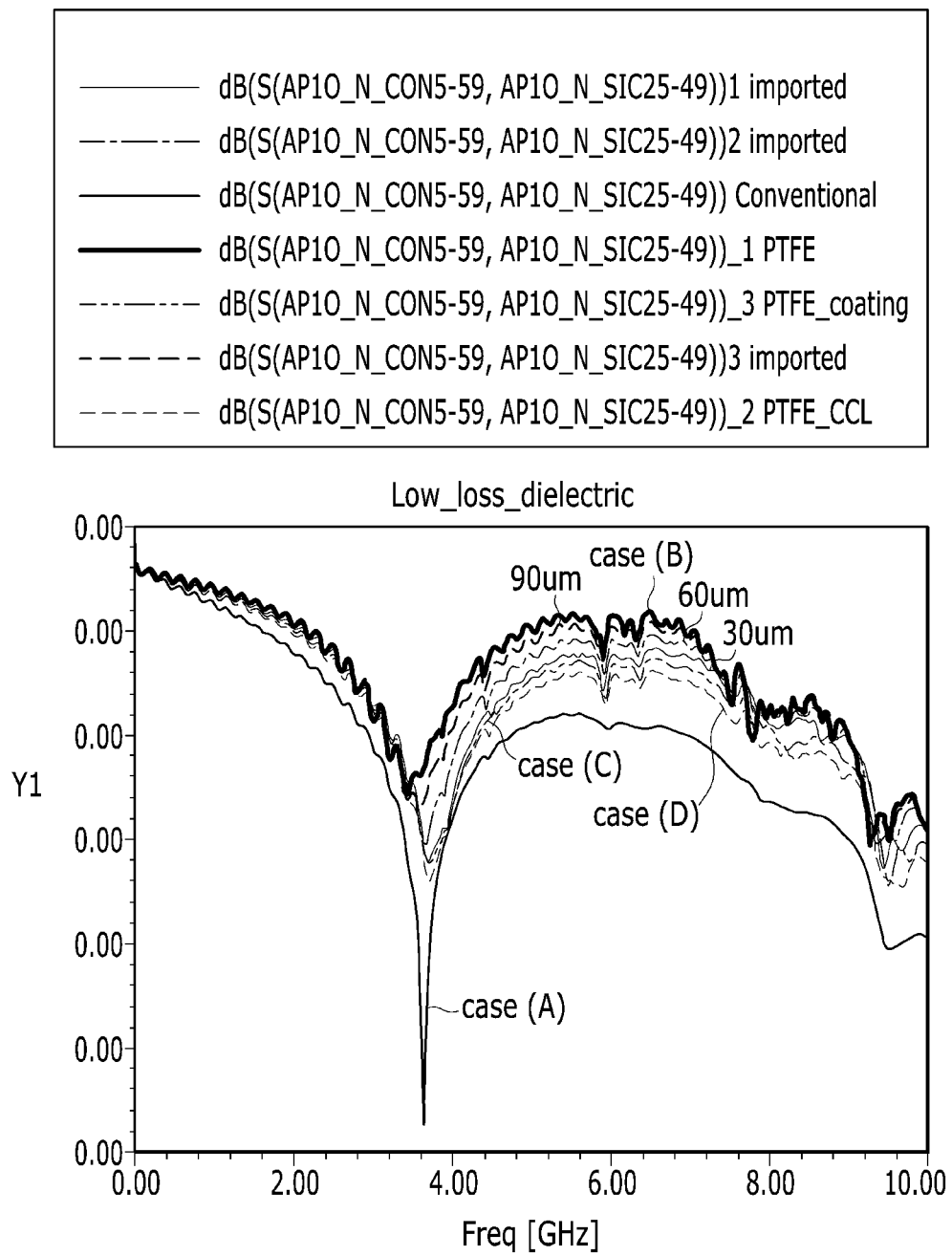
FIG. 8 is a graph illustrating an s-parameter according to a thickness of a low-loss material layer.
Figure 9A:
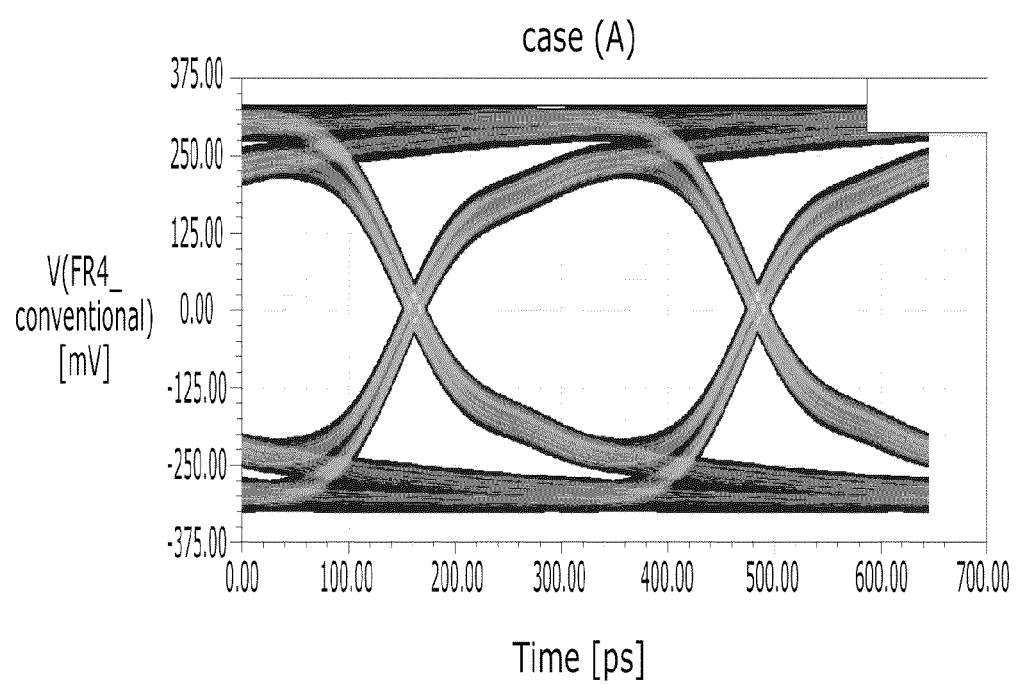
FIGS. 9A-9E illustrates eye diagrams according to thicknesses of a low-loss material layer.
Figure 9B:
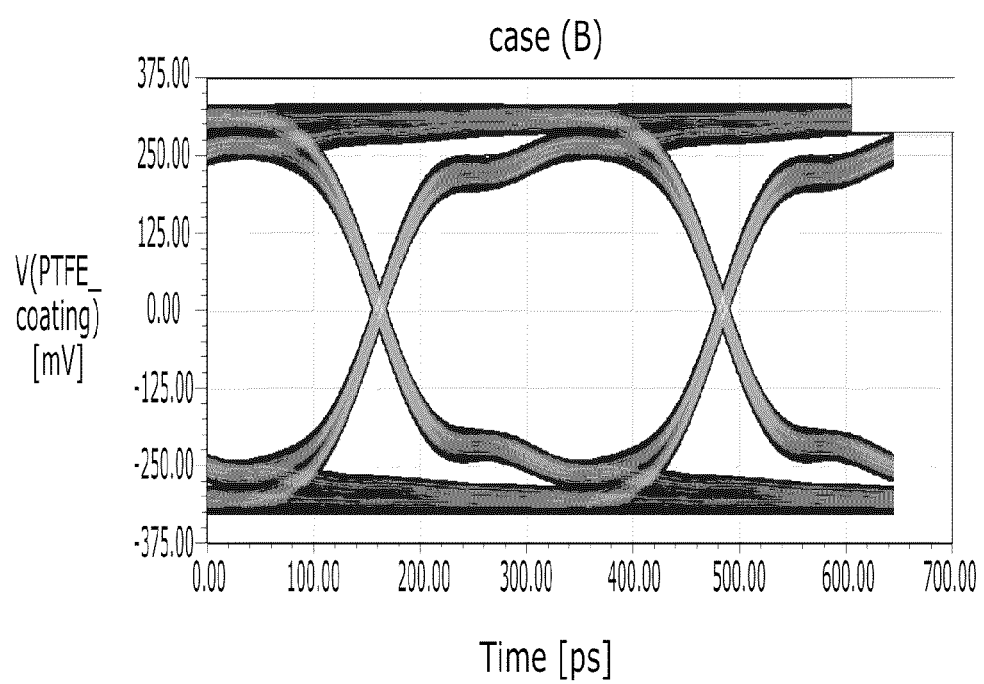
Figure 9C:
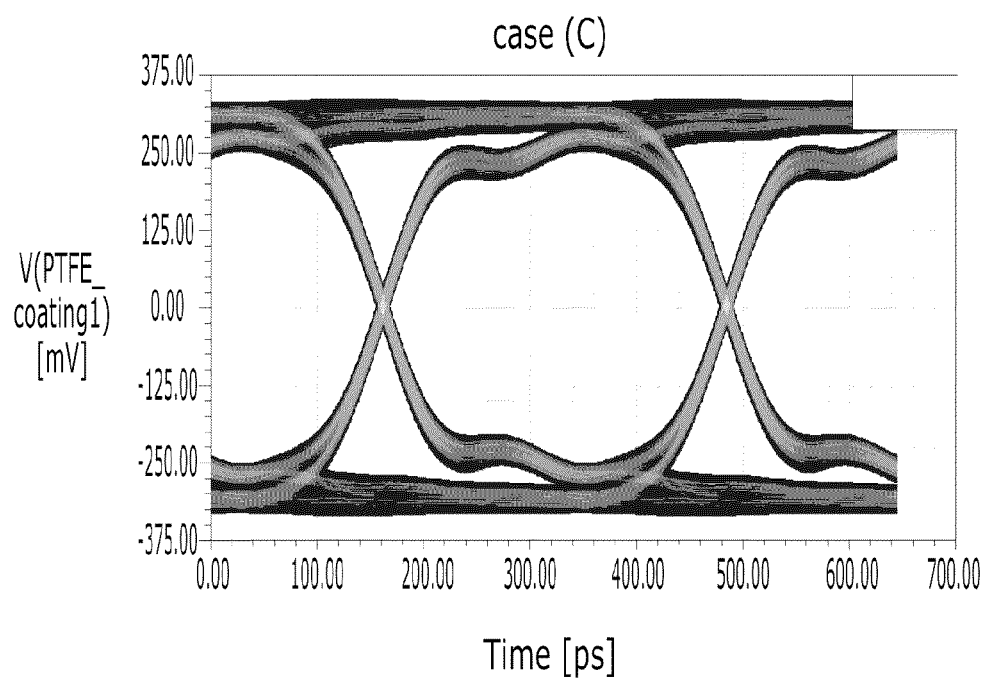
Figure 9D:
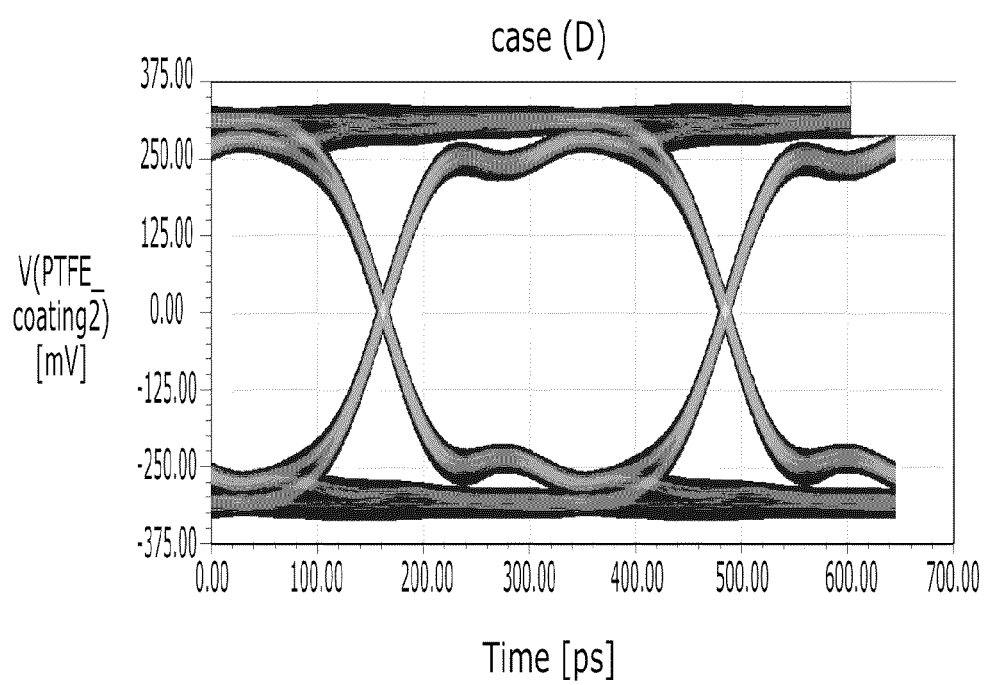
Figure 9E:
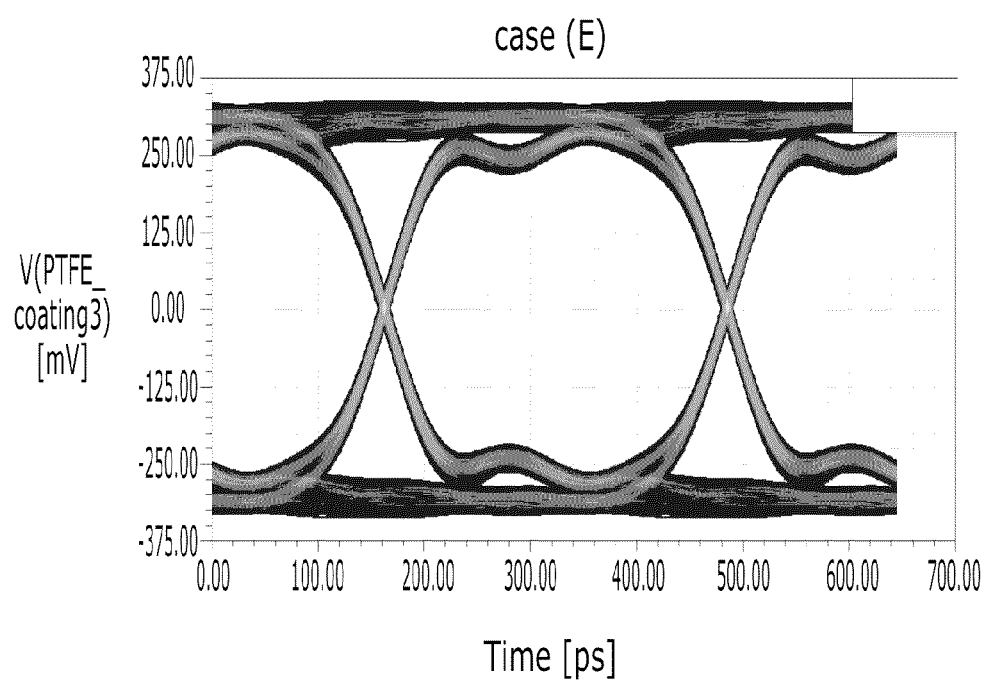

FIG. 8 is a graph illustrating an s-parameter according to a thickness of a low-loss material layer.

FIGS. 9A-9E, respectively, show graphs illustrating eye diagrams of a printed circuit board (FIG. 9A) in which all the insulating layers are FR4 and no low-loss material layer is used, a printed circuit board (FIG. 9B) in which a low-loss material layer having a thickness of 10 μm is used, a printed circuit board (FIG. 9C) in which a low-loss material layer having a thickness of 30 μm is used, a printed circuit board (FIG. 9D) in which a low-loss material layer having a thickness of 60 μm is used, and a printed circuit board (FIG. 9E) in which a low-loss material layer having a thickness of 90 μm is used.

Figure 10:
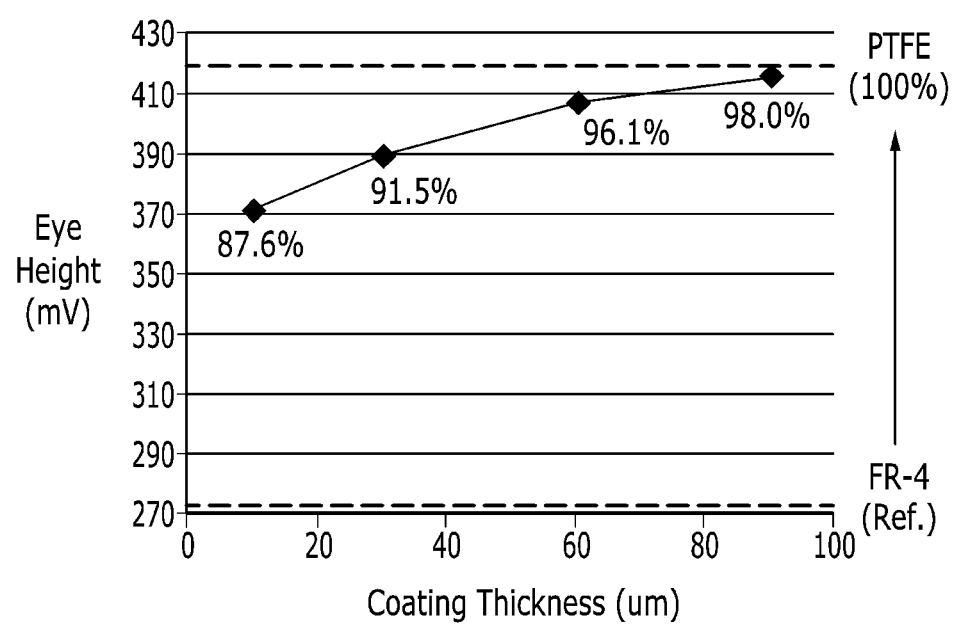
FIG. 10 is a graph illustrating improvement degree of signal quality according to a thickness of a low-loss material layer as a percentage.

FIG. 10 is a graph illustrating improvement degree of signal quality according to a thickness of a low-loss material layer as a percentage.

Referring to FIG. 8, the printed circuit board in which all the insulating layers are low-loss material layers (i.e. the thickness low-loss material layer is 112 μm) has the best signal quality. Subsequently, good quality is represented in the order of thickness values (90 μm>60 μm>30 μm>10 μm) of the low-loss material layer.

Further, in view of FIGS. 9A-9E and the results in Table 2 derived by performing transient simulation of the s-parameter of FIG. 8, it can be seen that the signal quality is increased as the thickness of the low-loss material layer is increased.

TABLE 2

|       | Eye height (mV) | Eye width (ps) | Increase of eye height (%) |
|-------|-----------------|----------------|----------------------------|
| (A)   | 278.30          | 289.00         | reference                  |
| 10 μm | 371.07          | 303.44         | 33                         |
| 30 μm | 389.49          | 305.75         | 39                         |
| 60 μm | 406.95          | 307.21         | 46                         |

TABLE 2-continued

| | Eye height (mV) | Eye width (ps) | Increase of eye height (%) |
|---|---|---|---|
| 90 μm | 415.02 | 208.29 | 49 |
| (B) | 423.19 | 208.52 | 52 |

As a result, a performance securing ratio of each printed circuit board as compared with the printed circuit board (B) (which is shown in FIG. 5B) is represented as a percentage in FIG. 10.

When the printed circuit board (B) is set as 100% of signal quality, the printed circuit boards having thicknesses of 10 μm, 30 μm, 60 μm, and 90 μm represent signal qualities of 87.6%, 91.5%, 96.1%, and 98.0%, respectively. Accordingly, in order to get signal quality improvement of about 90% or more, the thickness of the low-loss material layer may be about 20 μm or more.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A printed circuit board, comprising:
   a plurality of signal wire layers comprising a first high-speed signal wire layer and a first low-speed signal wire layer, wherein the first high-speed signal wire layer is connected to a source of signals of a data speed of 3.0 Gbps or higher whereas the first low-speed signal wire layer is not connected to a source of signals of a data speed of 3.0 Gbps or higher;
   a plurality of high-loss insulation layers made of a high-loss insulation material; and
   a plurality of low-loss insulation layers made of a low-loss insulation,
   wherein a frequency-dependent loss of the high-loss insulation material greater than that of the low-loss insulation material,
   wherein the first high-speed signal wire layer, a first one of the plurality of low-loss insulation layers, a first one of the plurality of high-loss insulation layers and the first low-speed signal wire layer are laminated in order such that the first low-loss insulation layer contacts the first high-speed signal wire layer and that the first high-loss insulation layer contacts the first low-speed signal wire layer.

2. A display device, comprising:
   a display panel; and
   the printed circuit board of claim 1 configured to apply a driving signal to the display panel.

3. The display device of claim 2, wherein the first low-loss insulation layer has a thickness of about 15% to about 100% of a thickness of the first high-loss insulation layer.

4. The display device of claim 2, wherein the low-loss insulation material comprises any one selected from the group consisting of hydrocarbon, ceramic, thermosetting polyester, and polytetrafluoroethylene (PTFE).

5. The printed circuit board of claim 1, wherein the first low-loss insulation layer has a thickness of about 15% to about 100% of a thickness of the first high-loss insulation layer.

6. The printed circuit board of claim 1, wherein the low-loss insulation material comprises any one selected from the group consisting of hydrocarbon, ceramic, thermosetting polyester, and polytetrafluoroethylene (PTFE).

7. The printed circuit board of claim 1, wherein the number of the a plurality of high-loss insulation layers is an odd number, wherein the printed circuit board has a laminated structure in which one of the plurality of high-loss insulation layers is disposed in the middle of the laminated structure and the other ones of the plurality of high-loss insulation layers are symmetrically arranged with respect to the insulation layer positioned in the middle.

8. The printed circuit board of claim 1, wherein the first high-speed signal wire layer is positioned at an outermost portion among the plurality of signal wire layers.

9. The printed circuit board of claim 1, wherein the first high-speed signal wire layer is positioned between two of the plurality of high-loss insulation layers.

10. The printed circuit board of claim 1, wherein the first high-speed signal wire layer is interposed between two of the plurality of low-loss insulation layers.

11. The printed circuit board of claim 10, wherein the first high-speed signal wire layer contacts the two low-loss insulation layers.

12. The printed circuit board of claim 1, wherein the first low-loss insulation layer contacts both the first high-loss insulation layer and the first high-speed signal wire layer.

13. A method of manufacturing a printed circuit board, comprising:
   forming signal wire layers comprising a first high-speed signal wire layer and a first low-speed signal wire layer, wherein the first high-speed signal wire layer is connected to a source of signals of a data speed of 3.0 Gbps or higher whereas the first low-speed signal wire layer is not connected to a source of signals of a data speed of 3.0 Gbps or higher;
   forming a plurality of high-loss insulation layers made of a high-loss insulation material and comprising a first high-loss insulation layer;
   forming a plurality of low-loss insulation layers made of a low-loss insulation material and comprising a first low-loss insulation layer,
   wherein a frequency-dependent loss of the high-loss insulation material greater than that of the low-loss insulation material,
   wherein the first high-speed signal wire layer, the first low-loss insulation layer, the first high-loss insulation layer and the first low-speed signal wire layer are laminated in order such that the first low-loss insulation layer contacts the first high-speed signal wire layer and that the first high-loss insulation layer contacts the first low-speed signal wire layer.

14. The method of claim 13, wherein the low-loss material layer is formed by spraying a liquid-state low-loss material.

15. The method of claim 13, wherein the low-loss material layer is formed by forming a thin film with a film-state low-loss material.

16. The method of claim 13, wherein the low-loss material layer has a thickness of about 15% to about 100% of a thickness of the insulation layer.

17. The method of claim 13, wherein the low-loss material layer comprises any one selected from the group consisting of hydrocarbon, ceramic, thermosetting polyester, and polytetrafluoroethylene (PTFE).

* * * * *